(12) United States Patent
Farrenkopf

(10) Patent No.: US 7,339,410 B1
(45) Date of Patent: Mar. 4, 2008

(54) METHOD AND SYSTEM FOR PROVIDING STARTUP DELAY

(75) Inventor: Douglas Farrenkopf, Campbell, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/737,617

(22) Filed: Dec. 15, 2003

(51) Int. Cl.
*H03K 3/02* (2006.01)

(52) U.S. Cl. ......................... 327/198; 327/143
(58) Field of Classification Search .............. 327/143, 327/198
See application file for complete search history.

(56) References Cited

U.S. PATENT DOCUMENTS

| | | | |
|---|---|---|---|
| 4,260,907 A * | 4/1981 | Winebarger | 327/143 |
| 5,519,346 A * | 5/1996 | Haddad et al. | 327/143 |
| 5,528,182 A * | 6/1996 | Yokosawa | 327/143 |
| 5,852,376 A * | 12/1998 | Kraus | 327/143 |
| 5,959,477 A * | 9/1999 | Chung | 327/143 |
| 5,969,549 A * | 10/1999 | Kim et al. | 327/143 |
| 6,144,238 A * | 11/2000 | Dasgupta | 327/143 |
| 6,163,206 A * | 12/2000 | Kobayashi | 327/540 |
| 6,586,975 B2 * | 7/2003 | Nagaya et al. | 327/143 |
| 6,614,358 B1 * | 9/2003 | Hutchison et al. | 340/815.45 |
| 6,642,757 B2 * | 11/2003 | Ikehashi et al. | 327/143 |
| 6,686,783 B1 * | 2/2004 | Huang | 327/143 |
| 2004/0189358 A1 * | 9/2004 | Kang | 327/143 |
| 2006/0176088 A1 * | 8/2006 | Fujiu et al. | 327/143 |

* cited by examiner

*Primary Examiner*—Kenneth B. Wells
*Assistant Examiner*—Ryan C Jager

(57) ABSTRACT

A method and system for providing startup delay is disclosed. The system includes a startup delay circuit. The startup delay circuit includes a signal generating sub-circuit that generates an output signal. The signal generating sub-circuit generates the output signal after a period of time that is related to an input offset of a component of the signal generating sub-circuit.

17 Claims, 5 Drawing Sheets

METHOD AND SYSTEM FOR PROVIDING STARTUP DELAY

FIELD OF THE INVENTION

The present invention relates generally to startup delay systems and methods. In particular, an embodiment of the present invention relates to a startup delay system for the control of semiconductor chips.

BACKGROUND OF THE INVENTION

Startup delay circuits assure the delivery of power to circuit components at the appropriate time. A startup delay circuit may be coupled to a circuit for the purpose of providing an appropriately timed startup signal. These circuits receive an input voltage, and after the expiration of a period of time, generate a signal that is used to initiate the operation of the system that it is coupled to. The signal may be delivered to circuits that rely on the delay to assure that they are fully powered before the startup signal is received.

Integrated circuits are an example of a type of circuit where the delivery of power at the appropriate time is critical. Integrated circuits are conventionally comprised of a plurality of distinct internal sub-circuits that function together as a part of an integrated circuit system. Each of the internal sub-circuits must receive power at the appropriate time in order to operate properly. There are many factors that can impact the proper delivery of power to the sub circuits of an integrated circuit.

Switching regulators are another example of a type of circuit where the proper delivery of power is critical. Often it is necessary for a switching regulator to be prevented from activating its switch until all of its internal circuits are powered up and operational. If its switch (which is connected in series with an inductor) is prematurely activated (before its internal circuits are properly powered) the regulator may be unable to ascertain the time at which it should turn the switch off. If the switch is left on too long, it may cause an excessive flow of current through the switch and through the inductor. This excessive flow of current could cause damage to these devices. Moreover, the excessive flow of current could cause the regulator's output voltage to rise to a level that could damage any circuit connected thereto.

As discussed above, to make sure that a device is not started (the regulator does not begin to switch) until all of its internal circuits have been powered, many conventional devices employ startup delay circuits which will prevent the device from operating (e.g., regulator from switching) until some delay time has elapsed after the devices input voltage has been applied.

An important characteristic of a suitable delay circuit is the capacity to provide sufficient delay time relative to the size of a given resistor capacitor pair. Many conventional delay circuits provide insufficient delay time relative to the size of the resistor and capacitor pair that they employ. Conventional delay circuits that are capable of providing longer delays require larger resistor and capacitor pairs. It should be appreciated that delay circuits that utilize larger components occupy more area on the integrated circuit chips that employ them. Consequently, the fabrication cost of the integrated circuit chip is increased.

SUMMARY OF THE INVENTION

Accordingly, a need exists for a method and system for providing startup delay. The present invention provides a method and system that accomplishes this need.

One embodiment of the present invention provides a startup delay system that includes a startup sub-system coupled to a startup delay sub-system. The startup delay sub-system includes a voltage limiting sub-circuit that is coupled to a supply voltage of said startup delay sub-system, a timing circuit and a signal generating sub-circuit. The signal generating sub-circuit has a first input that is coupled to the supply voltage of the startup delay sub-system and a second input coupled to a node of the timing circuit. The signal generating sub-circuit generates an output signal when the node of the timing circuit reaches a voltage level that is equal to the supply voltage of the startup delay sub-system minus an input offset magnitude of the signal generating sub-circuit.

In another embodiment, a startup delay circuit is provided. The startup delay circuit includes a signal generating sub-circuit that generates an output signal. The signal generating sub-circuit generates the output signal after a period of time that is related to an input offset of a component of the signal generating sub-circuit.

One embodiment of the present invention includes a method for providing startup delay. The method includes charging a first node to a first voltage level and charging a second node to a second voltage level that is equal to the first voltage level minus an offset magnitude. An output signal is generated when the second node is charged to the second voltage level. The second voltage level is reached after a period of time that is related to the offset magnitude.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
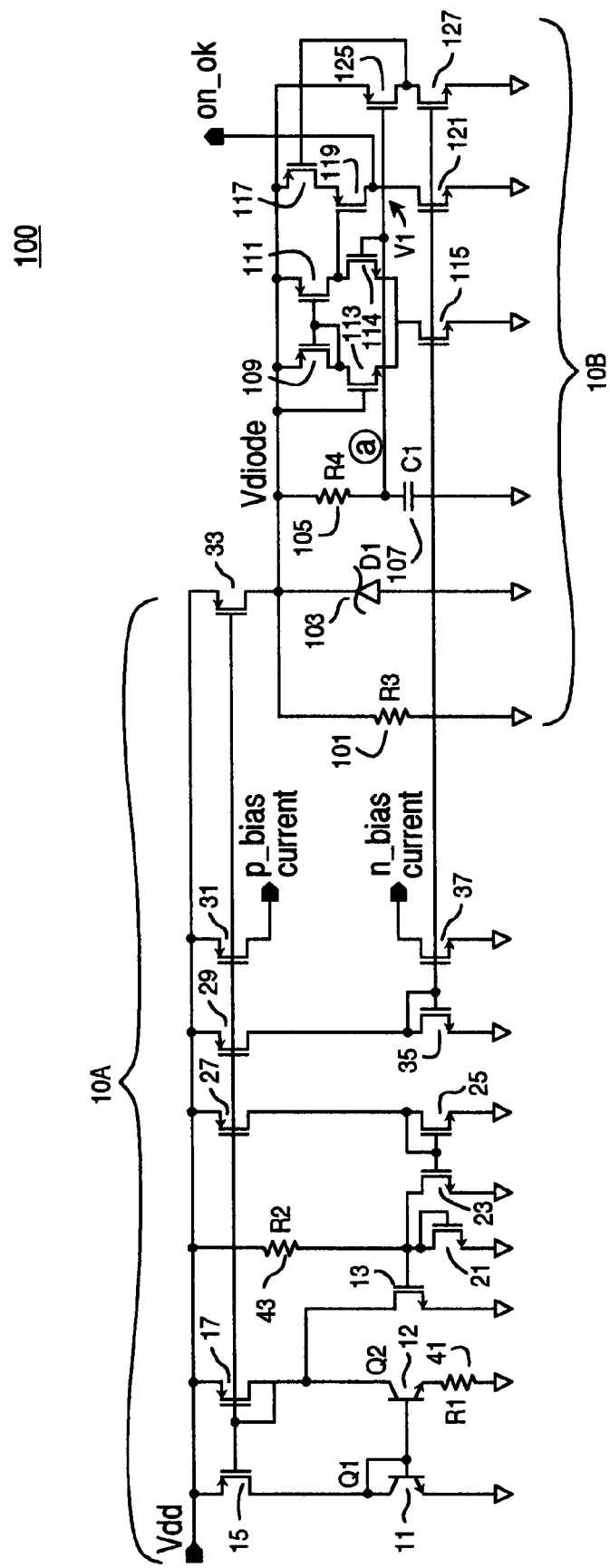
FIG. 1A shows a startup delay system including startup subsystem and delay subsystem according to one embodiment of the present invention.

Exemplary Startup Delay System in Accordance with Embodiments of the Invention FIG. 1A shows a startup delay system 100 including startup subsystem 10A and delay subsystem 10B according to one embodiment of the present invention. According to exemplary embodiments, the startup subsystem 10A may supply a startup current to the startup delay subsystem 10B. According to such embodiments, in response to the startup current that is supplied by the startup subsystem, a delayed startup signal generating sub-circuit (FIG. 1B, structure 150) of the delay subsystem 10B is prompted to generate a delayed startup signal after a period of time that is related to an input offset of an operational amplifier of the delayed startup signal generating sub-circuit. The delayed startup signal may be delivered to circuits that rely on the delay to assure that they are fully powered and operational before they are allowed to begin performing the functions that they are configured to perform.

Startup subsystem 10A may constitute a typical startup circuit according to one embodiment of the present invention. Startup subsystem 10A generates a startup current that is supplied to startup delay subsystem 10B. Startup subsystem 10A includes transistors 15-37 and Q1 11 and Q2 12, and resistors 41 and 43. The voltage across resistor R1 41 produces a startup current that is mirrored to transistor 33 and supplied to startup delay system 10B. The current that is supplied by startup subsystem 10A to startup delay subsystem 10B initiates the delay that may expire before a digital delayed startup signal is generated.

It should be appreciated that the startup current in transistors 15 and 17 (which may have the same width to length ratio (W/L)), which is mirrored to transistor 33 and supplied to startup delay subsystem 10B, according to one embodiment, is given by the equation:

$$I=(kT/q)\ln(\text{Area}Q2/\text{Area}Q1)/R1$$

where kT/q is the thermal voltage. According to one embodiment, transistors 31 and 37 may be used to deliver a bias current (p-bias and n-bias respectively) to other circuits that may be resident on a chip with startup subsystem 10A.

Figure 1B:
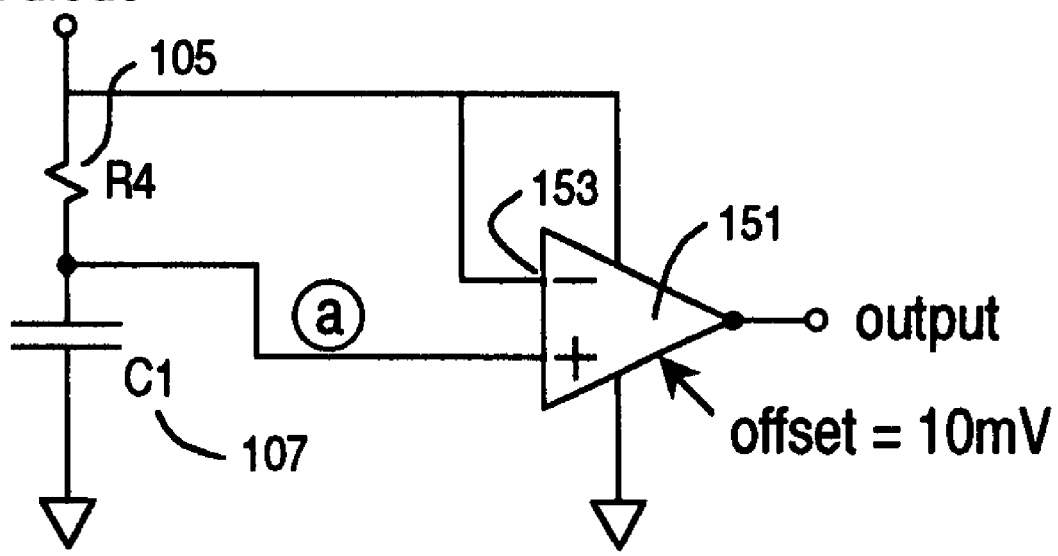
FIG. 1B shows a delayed startup signal generating sub-circuit according to one embodiment of the present invention.

The startup delay subsystem 10B shown in FIG. 1A includes one possible implementation of the aforementioned delayed startup signal generating sub-circuit 150 shown in FIG. 1B. It should be appreciated that other implementations may be employed. As is shown in FIG. 1B, the delayed startup signal generating sub-circuit 150 features a comparator 151 that has an inverting input 153 that is connected to the rail voltage (e.g., supply voltage) of the startup delay subsystem and that exhibits an input offset. It should be appreciated that the non-inverting input of the comparator 151 is connected to node A (see also FIG. 1A) which is located between resistor R4 105 and capacitor C1 107.

The delayed startup signal generating sub-circuit 150 is prompted by the application of power to node Vdd of startup subsystem 10A to generate a digital output signal after a period of time has expired. The time period is related to the input offset of a comparator of the delayed startup signal generating sub-circuit 150. The delayed startup signal generating sub-circuit includes an RC circuit that includes resistor R4 105 and capacitor C1 107. For given values of R and C the delay time gets larger as the input offset of the delayed startup signal generating sub-circuit (e.g., comparator) gets smaller. The delayed startup signal generating sub-circuit 150 generates a digital signal that goes high once a delay time has expired.

Referring again to FIG. 1A, the startup delay system 10B includes a voltage limiting sub-circuit (see also FIG. 3 structure 303) that includes resistor R3 101 and diode 103. At t=0 sec, power is applied to Vdd of delay system 100 which quickly reaches its steady state value. Resistor 101 insures that the voltage at node Vdiode (see FIG. 1A) is held to zero volts (resistor 101 prevents Vdiode from floating) prior to the application of power (voltage) to Vdd. It should be appreciated that if the current that is supplied to diode 103 from the startup circuit is higher than the steady state current value of the delay system 100, then diode 103 acts to prevent Vdiode from rising above its reverse breakdown voltage. Moreover, the effect of glitches and voltage spikes that may impact circuit operation (of a circuit prompted to start its operations by the startup delay system 100) may be eliminated by the action of diode 103. According to an alternate embodiment, diode 103 may be coupled directly to Vdd.

As previously mentioned, the delay system 10B includes a delayed startup signal generating sub-circuit (e.g., 150) that generates a digital signal (e.g., delayed startup signal) that goes high once a delay time has expired. The embodiment of the delayed startup signal generating sub-circuit shown in FIG. 1A includes transistors 109, 111, 113, 114, 115 and 117 (which form the input stage of a comparator). In addition, the delayed startup signal generating sub-circuit includes transistors 119 and 121. In the embodiment shown in FIG. 1A, transistors 109 and 111 may have the same W/L ratio.

It should be appreciated that according to one embodiment, as discussed above, the startup delay signal generating sub-circuit (e.g., 150) may include a comparator. According to such embodiments, if the W/L ratios of 113 and 114 were the same, the comparator would have a zero mV input offset. According to one embodiment, the W/L ratio of 114 may be slightly larger than that of 113. As discussed above, the delayed startup signal generating sub-circuit (e.g., 150 FIG. 1B) generates a digital signal (e.g., delayed startup signal) that goes high once a delay time has expired (see below discussion).

Referring to FIG. 1A, the on_ok signal (e.g., the delayed startup signal) is a digital signal that goes high once a designated delay time has expired. This signal tells a circuit that receives the delayed startup signal that sufficient time has expired since the application of Vdd, and that it is alright for the circuit to begin performing its function. For example, if the digital signal prompts the startup of a switching regulator, it may provide an indication to the switching regulator that it is alright to start switching its high current switch.

As discussed above, the delayed startup signal generating sub-circuit includes an RC circuit pair that includes resistor 105 and capacitor 107. The RC circuit pair establishes the time constant of the startup delay subsystem 10B. Voltage V1, located at the node between resistor 105 and capacitor 107, (see node A in FIG. 1A) ramps up (rises) according to the equation $V1=Vdiode(1-exp(-t/R4*C1))$. This voltage determines when the comparator of the delayed signal generating sub-circuit will trip.

According to one embodiment, resistor R4 105 may be implemented with either a poly resistor or an n-type resistor in a p-well which is grounded. It should be noted that if resistor R4 105 were a p type resistor in an n-well which rises to a high voltage, there may be an undesirable parasitic charge injection from the n-well through resistor R4 105 to capacitor C1 107 at startup. This may cause the voltage on C1 107 to spike up which would be undesirable. It should be noted that the voltage V1 at the node between resistor 105 and capacitor 107 is made to increase with time as is discussed with reference to FIG. 2C.

The startup delay sub-system 10B includes a safety sub-circuit that includes transistors 117, 125, and 127. The safety sub-circuit insures the expiration of the delay time before the on_ok signal goes "high". According to one embodiment, when power is initially applied to Vdd, V1 may be "low" which may operate to turn transistor 125 "on". It should be appreciated that when this occurs transistor 117 may be kept "off" which in turn may operate to prevent the on_ok signal from going "high." According to exemplary embodiments, transistor 117 must be turned "on" in order for the on_ok signal to be driven "high". According to such embodiments, transistor 117 may not turn "on" until voltage V1 rises to Vdiode+Vtp, where Vtp is the threshold voltage of transistor 125 (Vtp is a negative voltage).

Advantages of embodiments of the present invention include the achievement of long start up delays without involving excessively large R4 and C1 values. For example, if R4=100K and C1=10 pF, a time constant of 1 usec would be provided. If in the example, Vdiode is equal to 5 volts and the comparator offset is equal to 10 millivolts, the comparator will trip when V1 is equal to 4.99V. Solving the equation $4.99=5(1-exp(-t/usec))$ for t, gives t=6.2 usec, which means the comparator may trip after more than 6 time constants.

According to one embodiment, for a given resistor R4 105 and capacitor C1 107, the delay time increases as the input offset voltage of the comparator (e.g., 151 FIG. 1B) decreases. The smallest input offset that is possible in such embodiments is determined by the statistical offset of the comparator (e.g., 151) due to the matching of its components, primarily transistors 113 and 114, and 109 and 111 (see FIG. 1A). For example, if the comparator was designed with an input offset of −1 mv, and if the statistical offset variation were +/−5 mv, then the voltage required to trip the comparator (e.g., 151) could be as high as Vdiode+4 mV. It should be noted that if the trip voltage is higher than Vdiode the comparator (e.g., 151) may not trip. Consequently, in the above case the tripping of the comparator (e.g., 151) cannot be assured with a designed offset as small as −1 mv for a statistical offset variation of +/−5 mv.

According to exemplary embodiments comparator types may be used which have inherently lower input offsets than do others. For example, if a bipolar comparator is used instead of a CMOS comparator (such as is utilized in the FIG. 1A embodiment) it would be possible to provide a statistical offset of +/−1 mv. This may be illustrated by considering that in the above example, if the designed offset were set to be −2 mv, the comparator would trip when V1=4.998V. In such a case, the time that would expire (delay time) before the comparator was tripped may be determined from the equation $4.998=5(1-exp(-t/usec))$. Solving this equation for t gives a delay time of 7.8 usec, which is almost 8 time constants.

Embodiments of the present invention may be employed as a measure to prevent a chip (or other circuit) from operating until a certain amount of time has elapsed after the chip is powered up. Thus, such embodiments ensure that the chip may not operate until all of its sub-circuits are powered up and ready to go. When employed in conjunction with a switching regulator, the delay system would not allow the switching regulator to start switching until the prescribed delay time had expired. It should be appreciated that although semiconductor chips and switching regulators have been mentioned, many other types of devices would also be able to find use for the herein disclosed invention embodiments.

A valuable aspect of the disclosed invention embodiments is that they allow a prescribed delay time to be many time constants for a given resistor and capacitor combination. This facilitates a reduction in the value and the size of the resistor and the capacitor combination, thus requiring less chip space for their implementation. Moreover, a reduction in resistor and capacitor sizes results in a lowering of chip cost.

Figure 2A:
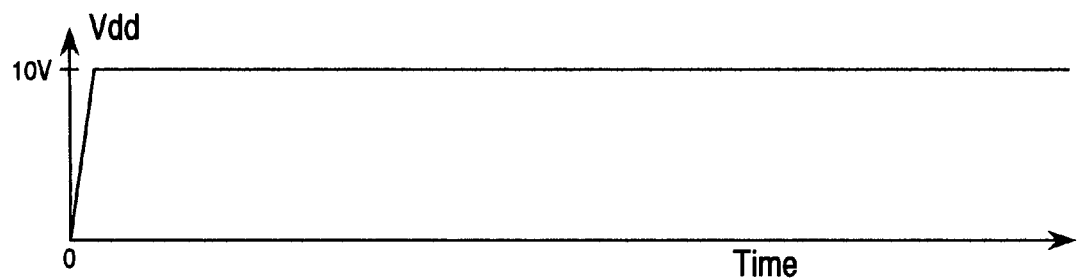
FIG. 2A shows the voltage changes over time at node Vdd according to one embodiment of the present invention.

FIGS. 2A-2D show voltage versus time graphs for selected nodes in the circuit of FIG. 1A according to one embodiment of the present invention. The graphs illustrate the voltage changes over time of nodes in the circuit of FIG. 1A. FIG. 2A shows the voltage changes over time at node Vdd. At t=0 seconds power is applied to Vdd of the circuit and Vdd quickly reaches its steady state value (10 volts in the FIG. 2A illustration). It should be appreciated that the circuit in FIG. 2A is intended for arbitrary Vdd voltages.

Figure 2B:
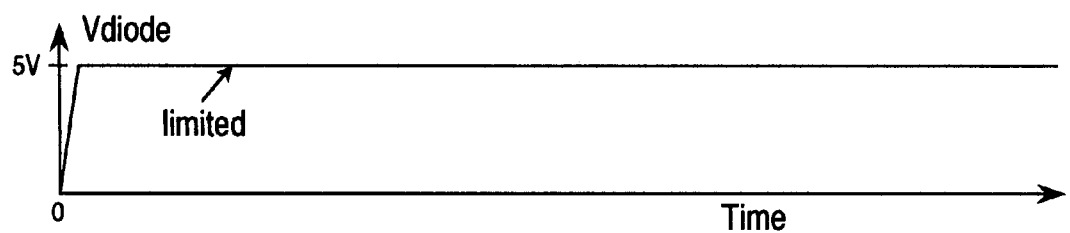
FIG. 2B shows the voltage changes over time that are exhibited at node Vdiode according to one embodiment of the present invention.

FIG. 2B shows the voltage changes over time that are exhibited at node Vdiode. According to one embodiment, Vdiode is maintained at a level of zero volts prior to a voltage being applied to Vdd. It should be appreciated that diode D1 (e.g., 103) prevents Vdiode from rising above its reverse voltage breakdown value, which in the embodiment shown in FIG. 2A is five volts. In that embodiment, it should be appreciated that if Vdd is large, diode D1 (e.g., 103, FIG. 1A) will limit Vdiode to five volts. In the embodiment of FIG. 1A, Vdiode quickly reaches its steady state value, as is shown in FIG. 2B.

Figure 2C:
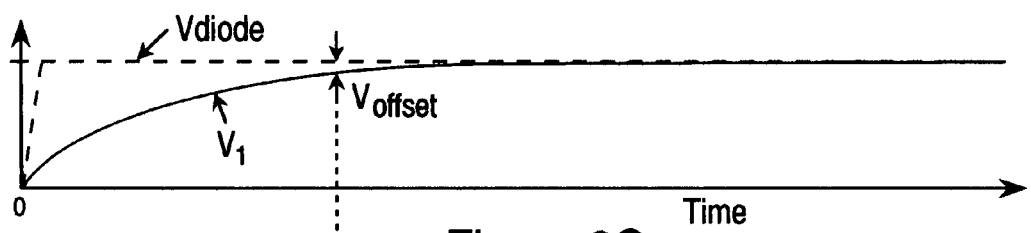
FIG. 2C shows the voltage changes over time that are exhibited at node A according to one embodiment of the present invention.

FIG. 2C shows the voltage changes over time that are exhibited at node A. According to one embodiment, the voltage at node A ramps up gradually according to the equation $V1=Vdiode(1-exp(-t/R4*C1))$. According to such embodiments, if for example the input offset of the operational amplifier (e.g., 151) of the startup delay signal generating sub-circuit is −10 mV (e.g., 0.01V) and Vdiode is 5 Volts the comparator (e.g., 151) will trip when V1=5V−10 mV=4.99V. FIG. 2C depicts the gradual ramping up of the voltage level that is exhibited at node A from zero volts to V1.

Figure 2D:
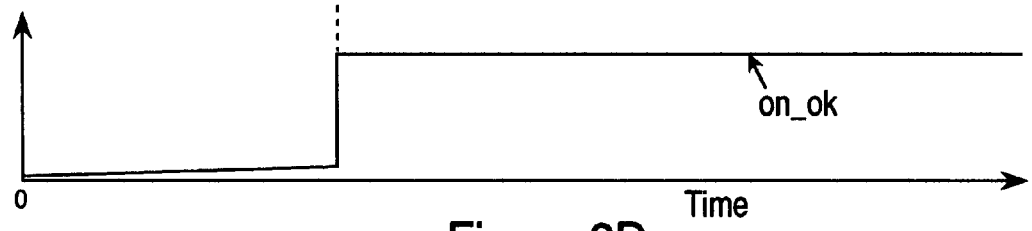
FIG. 2D illustrates the behavior of the delayed startup signal over time according to one embodiment of the present invention.

FIG. 2D illustrates the behavior of the delayed startup signal over time. The delayed startup signal (e.g., on_ok signal in FIG. 1A) constitutes a digital signal that goes high once a designated delay time has expired. This signal tells a circuit to which it is coupled that a specified delay time has elapsed since the application of Vdd, and that it is "ok" for the chip to begin performing its function. FIG. 2D shows that the delayed startup signal changes immediately from 0 volts to its active voltage level upon V1 (see FIG. 2C) reaching a predetermined voltage level.

Figure 3:
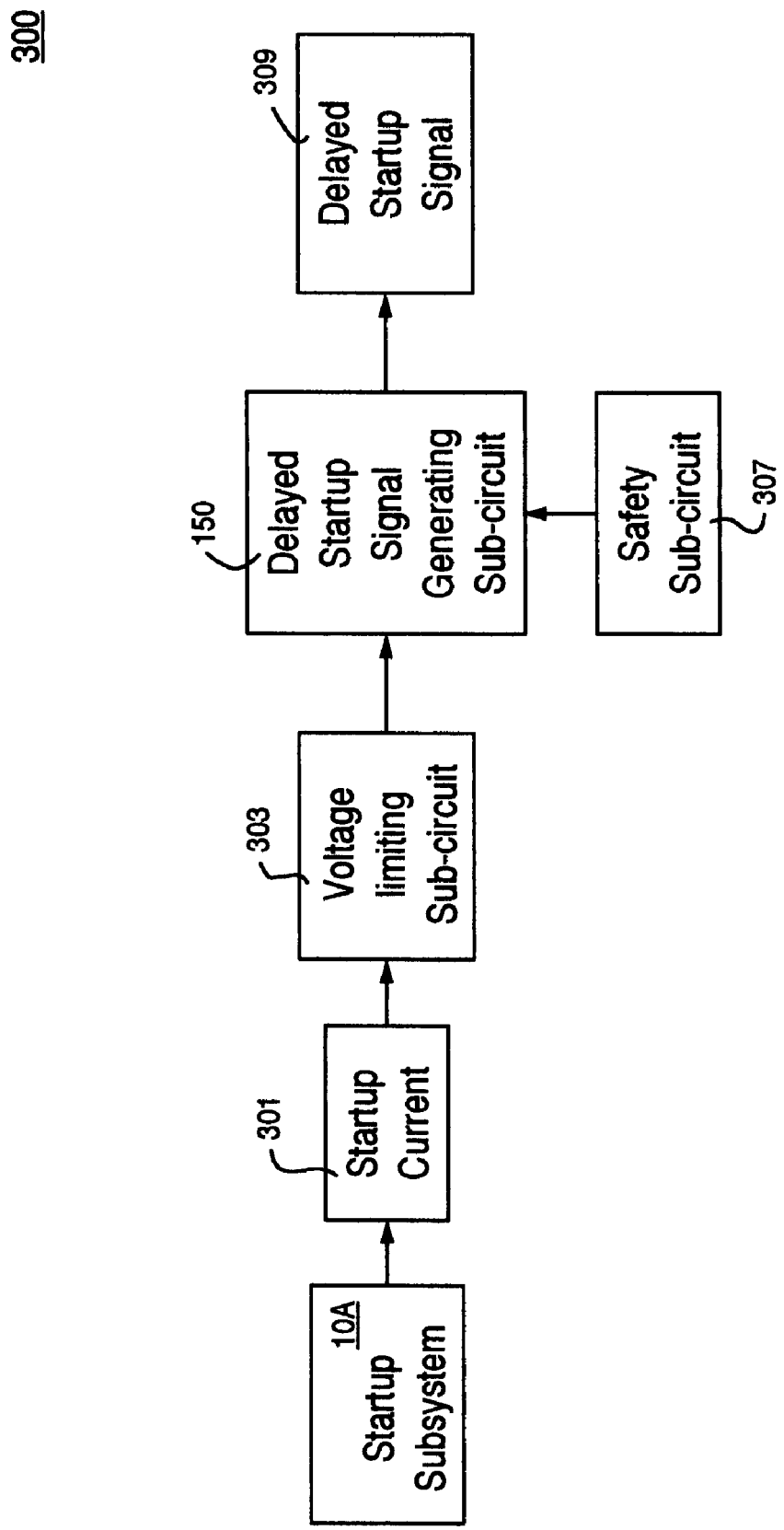
FIG. 3 shows a functional block diagram illustrating the interrelationship of the startup delay system components according to one embodiment of the present invention.

FIG. 3 shows a functional block diagram illustrating the interrelationship of the startup delay system components according to one embodiment of the present invention. Startup subsystem 10A provides a startup current 301 to voltage limiting sub-circuit 303. The startup current 301 that is received by the voltage limiting sub-circuit 303 establishes a voltage input to the delayed startup signal generating sub-circuit 150. Thereafter, the delayed startup signal generating sub-circuit 150 may generate a delayed startup signal 309 which may be provided to other circuit(s) as a prompt to begin operations. It should be appreciated that safety sub-circuit 307 insures the expiration of a designated delay time before the on_ok signal (e.g., delayed startup signal) goes "high".

Exemplary Operations in Accordance with Embodiments of the Invention

Figure 4:
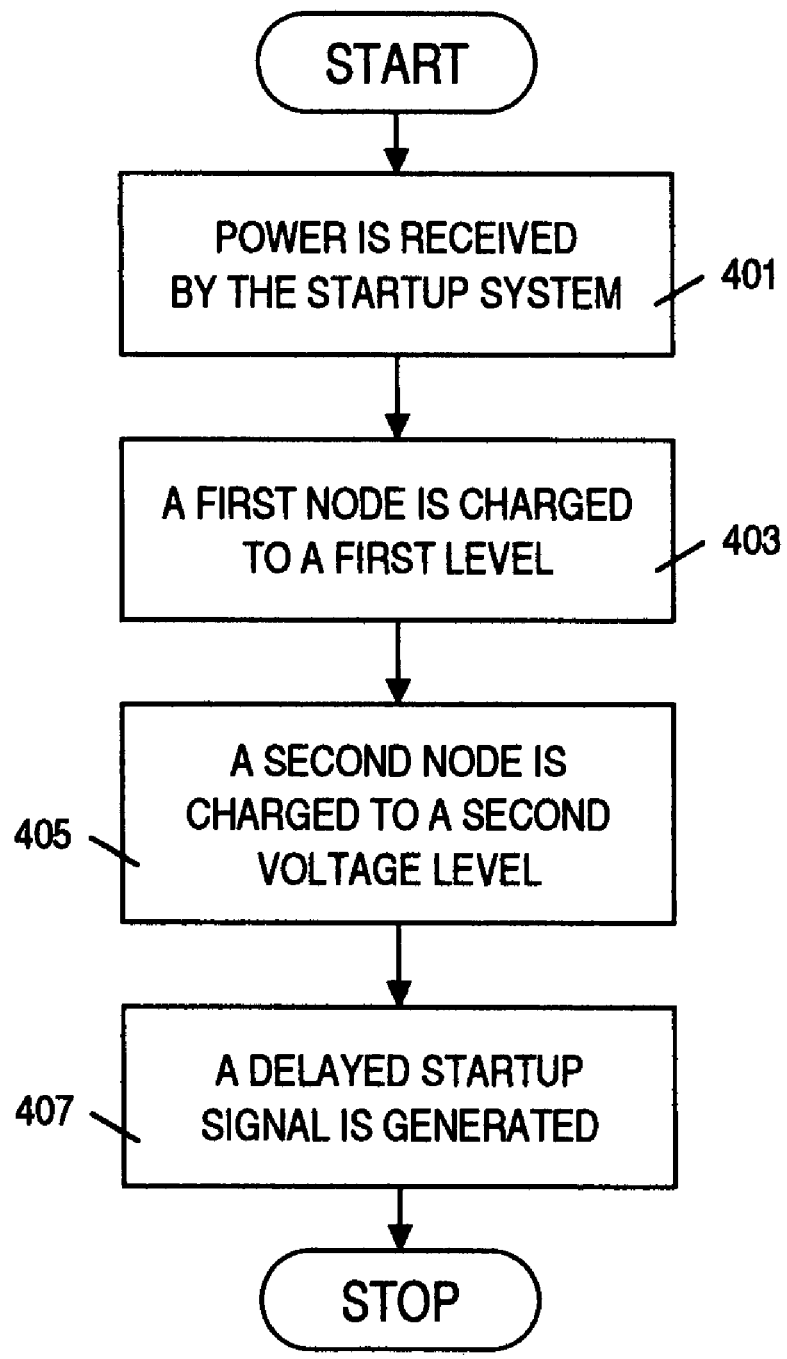
FIG. 4 shows a flowchart of the steps executed in a process for providing a startup delay signal according to one embodiment of the present invention.

FIG. 4 shows a flowchart 400 of the steps executed in a process for providing a startup delay signal according to one embodiment of the present invention. Although specific steps are disclosed in the flowchart such steps are exemplary. That is, the present invention is well suited to performing various other steps or variations of the steps recited in the flowchart. It should be noted that the following flowchart is discussed herein with reference to elements described with reference to previous Figures.

At step 401, power is received by the startup system (e.g., 100 FIG. 1). At t=0 sec, power is applied to node Vdd of the startup system 100 which quickly reaches its steady state value. It should be appreciated that if the current that is supplied to a voltage limiting subcircuit of the start up delay system (e.g., D1 103) from the startup system is higher than the steady state current value of Vdiode, a diode (e.g., D1 103) may act to prevent Vdiode from rising above its reverse breakdown voltage.

At step 403, a first node is charged to a first voltage level (e.g., Vdiode) in response to the application of power to Vdd. The power that is received at Vdd is supplied to a voltage limiting sub-circuit of the startup delay system that includes a resistor (e.g., R3 101) and a diode (e.g., D1 103). As mentioned above, the diode (e.g., D1 103) may act to prevent Vdiode from rising to a voltage level that is greater than its reverse breakdown voltage. The aforementioned resistor (e.g., R3 101) insures that the voltage (e.g., Vdiode) across the aforementioned diode (e.g., 103) is maintained at zero volts (resistor R3 101 prevents Vdiode from floating) prior to power being applied to Vdd.

At step 405, a second node is charged to a second voltage level (e.g., V1) that is equal to the first voltage level minus an offset magnitude. This voltage ramps up gradually until its steady state is reached. It should be appreciated that start up delay system 100 may include an RC circuit that includes a resistor (e.g., R4 105) and a capacitor (e.g., C1 107). The voltage level at the second node (e.g., A in FIG. 1) ramps up (rises) according to the equation V1=Vdiode (1−exp(−t/R4*C1)). FIG. 2C depicts the gradual ramping up of the voltage level that is exhibited at the second node.

At step 407, a delayed startup signal is generated. According to one embodiment, the delayed startup signal is generated by a delayed startup signal generating sub-circuit once the voltage level at the aforementioned second node reaches a second voltage level that is equal to the first voltage level minus an offset magnitude. According to such embodiments, if for example the input offset is −10 mV (e.g., 0.001V) and Vdiode is 5 Volts, a comparator of the signal generating sub-circuit will trip when V1=5V−10 mV=4.99V.

The output signal constitutes an "on_ok" signal. The "on_ok" signal is a digital signal that goes high once a designated delay time has expired. This signal is configured to tell a circuit that sufficient time has expired since the application of Vdd, and that it is alright for the circuit to begin its operation. For example, if the digital signal is prompting the startup of a switching regulator, it may signal to the switching regulator that it may start switching its high current switch. As previously discussed, the delayed output signal is generated when the voltage at the second node is equal to the voltage at the first node minus an input offset.

A method and system for providing startup delay is disclosed. The method includes charging a first node to a first voltage level and charging a second node to a second voltage level that is equal to the first voltage level minus an offset magnitude. An output signal is generated. A signal generating sub-circuit is prompted to generate the output signal when the second node is charged to the second voltage level. The second voltage level is reached after a period of time that is related to the offset magnitude.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

The invention claimed is:

1. A startup delay circuit comprising:
   a signal generating sub-circuit that generates a delayed startup signal that prompts a circuit that has been fully powered to startup upon receipt of said delayed startup signal; wherein said signal generating sub-circuit generates said delayed startup signal after a delay that is dependent on an input offset of a component of said signal generating sub-circuit and that is a multiple of an RC (resistor/capacitor) time constant, wherein said signal generating sub-circuit comprises a plurality of transistors coupled to said component and that form said input offset.

2. The startup delay circuit of claim 1 wherein said signal generating sub-circuit comprises a comparator having an inverting input coupled to a supply voltage.

3. The startup delay circuit of claim 1 further comprising a voltage limiting sub-circuit that comprises a component that limits the magnitude of a voltage that is supplied to the signal generating sub-circuit.

4. The startup delay circuit of claim 1 wherein a limit on the length of said period of time is determined by a statistical offset variation of said component due to said plurality of transistors.

5. The startup delay circuit of claim 1 wherein said output signal is a digital signal that goes high after said period of time has passed.

6. The startup delay circuit of claim 1 further comprising a safety sub-circuit which prevents said output signal generated by said signal generating sub-circuit from going high until said period of time has passed.

7. A startup delay system comprising a startup sub-system and a startup delay sub-system coupled to said startup sub-system, said startup delay sub-system comprising:
   a voltage limiting sub-circuit coupled to a supply voltage of said startup delay sub-system;
   a timing circuit; and
   a signal generating sub-circuit having a first input coupled to said supply voltage of said startup delay sub-system and a second input coupled to a node of said timing circuit, wherein said signal generating sub-circuit generates a delayed startup signal that prompts a circuit that has been fully powered to startup and that is a multiple of an RC (resistor/capacitor) time constant when said node of said timing circuit reaches a voltage level that is equal to said supply voltage of said startup delay sub-system minus an input offset magnitude of said signal generating sub-circuit, wherein said startup delay sub-system further comprises a plurality of transistors coupled to said signal generating sub-circuit and that form said input offset.

8. The startup delay circuit of claim 7 wherein said signal generating sub-circuit comprises a comparator, and wherein said first input comprises an inverting input of said comparator that is coupled to the supply voltage of said startup delay sub-system, wherein said supply voltage of said startup delay sub-system is derived from a supply voltage of said startup sub-system.

9. The startup delay circuit of claim 8 wherein said voltage limiting sub-circuit comprises a component that limits the magnitude of said supply voltage of said startup delay sub-system.

10. The startup delay circuit of claim 7 wherein said node of said timing circuit provides a delayed version of said supply voltage of said startup delay sub-system.

11. The startup delay circuit of claim 7 wherein said output signal goes high after said period of time has passed and wherein said period of time is related to said input offset, wherein said input offset magnitude is due to said plurality of transistors.

12. The startup delay circuit of claim 7 further comprising a safety sub-circuit which prevents said output signal generated by said signal generating sub-circuit from going high until said period of time has passed.

13. A method for providing a startup delay comprising:
   charging a first node to a first voltage level;
   charging a second node to a second voltage level that is equal to said first voltage level minus an offset magnitude; and
   generating a delayed startup signal with a delay that is a multiple of an RC (resistor/capacitor) time constant, wherein a signal generating sub-circuit generates said delayed startup signal when said second node is charged to said second voltage level and wherein said second voltage level is reached after a period of time that is related to said offset magnitude, wherein said signal generating sub-circuit comprises a plurality of transistors coupled to said component and wherein said offset magnitude is due to said transistors.

14. The method of claim 13 wherein said signal generating sub-circuit comprises a comparator having an inverting input coupled to a supply voltage.

15. The method of claim 14 wherein a limit on the length of said period of time is determined by a statistical offset variation of said comparator in said signal generating sub-circuit, wherein said statistical offset variation is due to said transistors.

16. The method of claim 13 wherein said output signal is a digital signal that goes high after said period of time has passed.

17. The method of claim 13 wherein a safety sub-circuit prevents the signal generating sub-circuit from going high until said period of time is reached.

* * * * *